United States Patent
Yu et al.

(10) Patent No.: US 10,854,446 B2
(45) Date of Patent: Dec. 1, 2020

(54) EPITAXIES OF A CHEMICAL COMPOUND SEMICONDUCTOR

(71) Applicants: Taiwan Semiconductor Manufacturing Company Limited, Hsinchu (TW); National Chiao-Tung University, Hsinchu (TW)

(72) Inventors: Hung-Wei Yu, Yilan County (TW); Yi Chang, Hsinchu County (TW); Tsun-Ming Wang, New Taipei (TW)

(73) Assignees: Taiwan Semiconductor Manufacturing Company Limited, Hsinchu (TW); National Chiao-Tung University, Hsinchu (TW)

( * ) Notice: Subject to any disclaimer, the term of this patent is extended or adjusted under 35 U.S.C. 154(b) by 0 days.

(21) Appl. No.: 16/101,568

(22) Filed: Aug. 13, 2018

(65) Prior Publication Data
US 2019/0006173 A1   Jan. 3, 2019

Related U.S. Application Data

(60) Division of application No. 15/063,572, filed on Mar. 8, 2016, now Pat. No. 10,049,872, which is a continuation of application No. 14/452,608, filed on Aug. 6, 2014, now Pat. No. 9,287,122.

(60) Provisional application No. 61/953,963, filed on Mar. 17, 2014.

(51) Int. Cl.
*H01L 21/02* (2006.01)
*H01L 29/10* (2006.01)
*H01L 29/205* (2006.01)
*H01L 29/778* (2006.01)

(52) U.S. Cl.
CPC ...... *H01L 21/0262* (2013.01); *H01L 21/0251* (2013.01); *H01L 21/02381* (2013.01); *H01L 21/02395* (2013.01); *H01L 21/02463* (2013.01); *H01L 21/02502* (2013.01); *H01L 21/02546* (2013.01); *H01L 21/02549* (2013.01); *H01L 29/1033* (2013.01); *H01L 29/205* (2013.01); *H01L 29/7781* (2013.01)

(58) Field of Classification Search
None
See application file for complete search history.

(56) References Cited

U.S. PATENT DOCUMENTS

| | | |
|---|---|---|
| 2001/0035530 A1 | 11/2001 | Udagawa |
| 2008/0230849 A1 | 9/2008 | Afzali-Ardakani et al. |
| 2009/0321717 A1 | 12/2009 | Pillarisetty et al. |
| 2011/0279146 A1 | 11/2011 | Koo et al. |
| 2013/0161698 A1* | 6/2013 | Marino ............ H01L 29/42316 257/194 |
| 2014/0004674 A1 | 1/2014 | Ando et al. |

(Continued)

*Primary Examiner* — Long Pham
(74) *Attorney, Agent, or Firm* — Jones Day

(57) ABSTRACT

Methods and structures includes providing a substrate, forming a prelayer over a substrate, forming a barrier layer over the prelayer, and forming a channel layer over the barrier layer. Forming the prelayer may include growing the prelayer at a graded temperature. Forming the barrier layer is such that the barrier layer may include GaAs or InGaAs. Forming the channel layer is such that the channel layer may include InAs or an Sb-based heterostructure. Thereby structures are formed.

20 Claims, 2 Drawing Sheets

(56) References Cited

U.S. PATENT DOCUMENTS

| | | | |
|---|---|---|---|
| 2014/0191252 A1* | 7/2014 | Lee | H01L 27/092 257/79 |
| 2014/0209979 A1* | 7/2014 | Lau | H01L 21/02461 257/194 |
| 2015/0050800 A1 | 2/2015 | Brand et al. | |
| 2016/0005700 A1 | 1/2016 | Rogers et al. | |

* cited by examiner

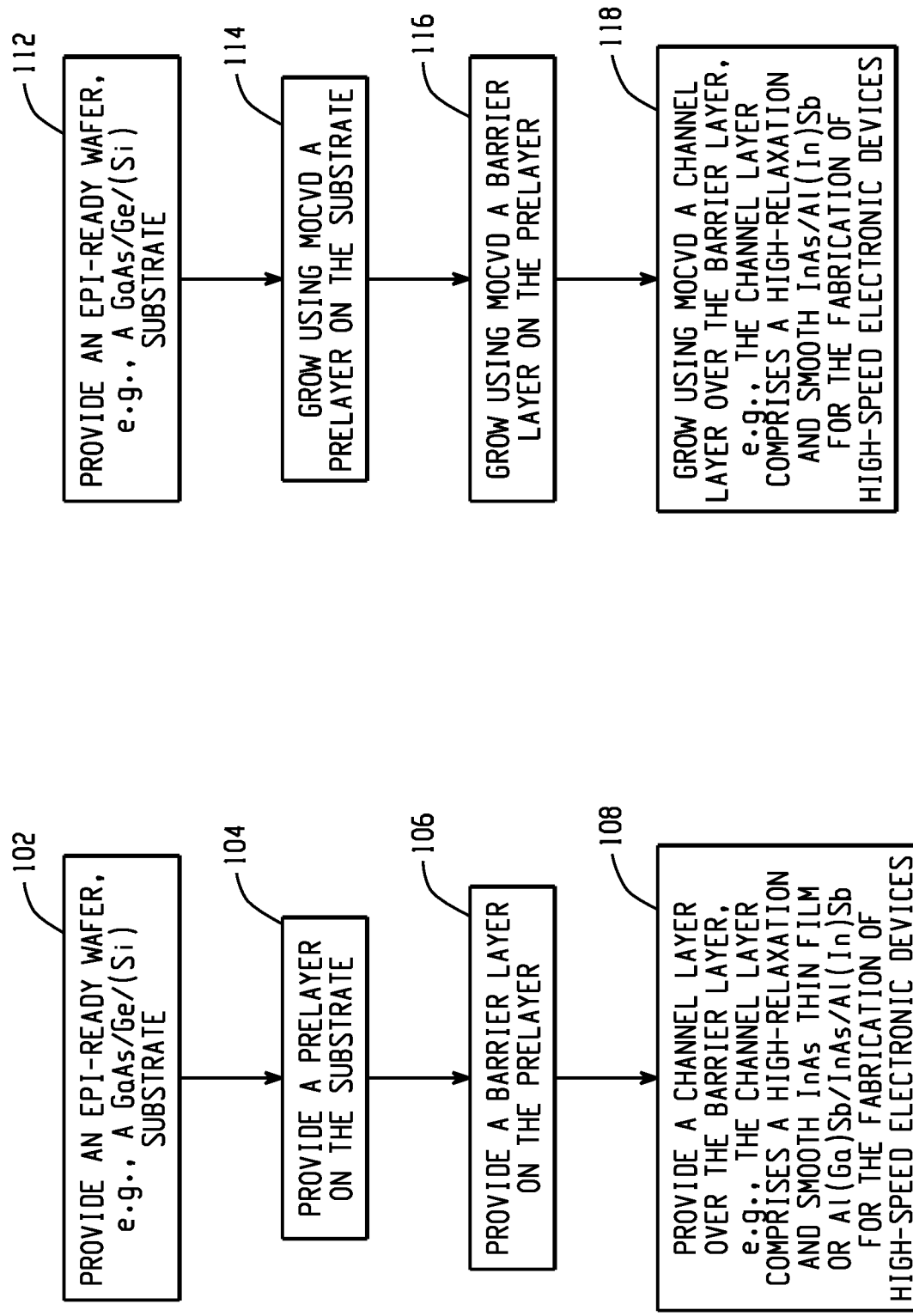

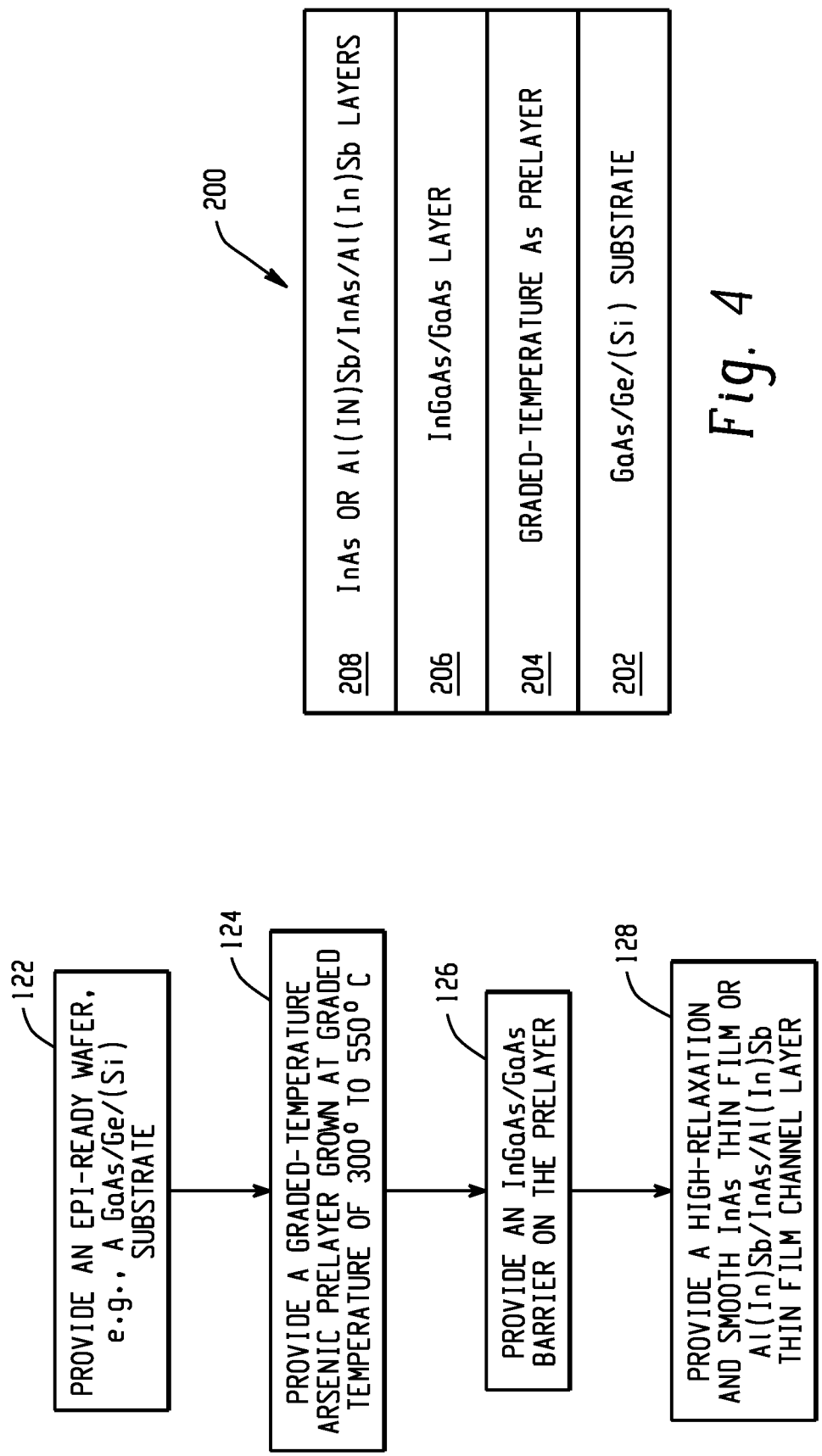

EPITAXIES OF A CHEMICAL COMPOUND SEMICONDUCTOR

CROSS-REFERENCE TO RELATED APPLICATION

The present application is a divisional application of U.S. patent application Ser. No. 15/063,572, which is a continuation of U.S. patent application Ser. No. 14/452,608, filed on Aug. 6, 2014, which has issued as U.S. Pat. No. 9,287,122, which claims priority from U.S. Provisional Application No. 61/953,963, filed on Mar. 17, 2014, all of which are hereby incorporated into the present application by reference in their entirety.

BACKGROUND

The technology described in this patent document relates to chemical compound semiconductors, and more specifically to forming a chemical compound semiconductor layer on a substrate.

Scaling of semiconductor devices, such as a MOSFET, has enabled continued improvement in speed, performance, density, and cost per unit function of integrated circuits over the past few decades. Improvements to the processes used in fabricating semiconductor structures can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 depicts an example process flow chart for creating a wafer that may be used in a semiconductor fabrication process.

FIG. 2 depicts another example process flow chart for creating a wafer that may be used in a semiconductor fabrication process.

FIG. 3 depicts another example process flow chart for creating a wafer that may be used in a semiconductor fabrication process.

FIG. 4 depicts a cross-sectional view of an example wafer that may be used in a semiconductor fabrication process.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Disclosed herein are structures and methods for growing type III-V materials as semiconductor layers on epi-ready wafers using MOCVD operations. In some examples, disclosed are techniques to grow In(Ga)As (or Al(Ga,In)Sb) epitaxy with high In content (~100%) or low In content on a GaAs substrate, a Ge substrate, a Si substrate and a Ge/Si substrate.

FIG. 1 depicts an example process flow chart for creating a wafer having a chemical compound semiconductor channel layer on a substrate that may be used in a semiconductor fabrication process. The example process comprises providing an epi-ready wafer, such as one comprising a GaAs substrate, a Ge substrate, a Si substrate, or a Ge/Si substrate (operation 102). A prelayer is provided over the substrate (operation 104). Next, a barrier layer is provided over the prelayer (operation 106). Then, a chemical compound semiconductor channel layer is provided over the barrier layer (operation 108). The example channel layer comprises a high-relaxation and smooth InAs thin film or In(Ga)As or Al(Ga)Sb/InAs/Al(Ga)Sb thin film for use in subsequent fabrication of high-speed electronic devices. This example process may allow for the use of a cheaper substrate, such as a Si, Ge, GaAs or Ge/Si substrate, instead of a GaSb or InP substrate and allow for In(Ga)As or Al(Ga)Sb/InAs/Al(Ga)Sb epilayers to be grown on the cheaper substrates.

FIG. 2 depicts another example process flow chart for creating a wafer having a chemical compound semiconductor channel layer on a substrate that may be used in a semiconductor fabrication process. The example process of FIG. 2 is similar to the example process of FIG. 1 and illustrates that each of the prelayer, barrier layer, and channel layer can be provided using metal organic chemical vapor deposition (MOCVD) operations. After providing an epi-reading wafer, such as one comprising a GaAs substrate, a Ge substrate, a Si substrate, or a Ge/Si substrate (operation 112), a prelayer is grown over the substrate using MOCVD operations (operation 114). Next, a barrier layer is grown over the prelayer using MOCVD operations (operation 116). Then, a chemical compound semiconductor channel layer is grown over the barrier layer using MOCVD operations (operation 118). The example channel layer comprises a high-relaxation and smooth InAs thin film or In(Ga)As or Al(Ga)Sb/InAs/Al(Ga)Sb thin film for use in subsequent fabrication of high-speed electronic devices. This example process may allow for the use of a cheaper substrate, such as a Si, Ge, GaAs, or Ge/Si substrate, instead of a GaSb or InP substrate and allow for In(Ga)As or Al(Ga)Sb/InAs/Al(Ga)Sb epilayers to be grown on the cheaper substrates.

FIG. 3 depicts another example process flow chart for creating a wafer having a chemical compound semiconductor channel layer on a substrate that may be used in a semiconductor fabrication process. In the example process of FIG. 3, after providing an epi-ready wafer, such as one comprising a GaAs substrate, a Ge substrate, a Si substrate, or a Ge/Si substrate (operation 122), a graded-temperature arsenic prelayer is grown over the substrate using MOCVD operations (operation 124). The graded-temperature arsenic prelayer may be grown at a graded temperature ramped from 300 to 550° C. In this example, the prelayer thickness is several nanometers but less than 10 nm.

Next, a barrier layer is grown over the prelayer using MOCVD operations (operation 126). The barrier layer in this example consists of a GaAs with low-growth-temperature growth or an $In_xGa_{1-x}As$ epitaxy with one or multiple GaAs-based layers. The thickness of the barrier layer(s) in this example is about 5-500 nm. Also, the barrier layer(s) is slightly P or N-type (~$10^{17}$ cm$^{-3}$).

Then, an InAs or Sb-based channel layer is grown over the barrier layer using MOCVD operations (operation 128). The example channel layer comprises an InAs epitaxy with low-growth-temperature growth or Al(In)Sb/InAs/Al(In)Sb heterostructures with one or more pairs deposited at a temperature of about 300~600 degree. In this example, the channel thickness is about 20-500 nm.

By using the example processes of FIGS. 1, 2, and 3, periodic 90° misfit dislocations may be generated between the barrier and channel layers to relax the strain. The channel layer of the devices generated using the examples of FIG. 1, 2, or 3 may be used in a semiconductor fabrication process for fabricating, for example, a high electron mobility transistor (HEMT), a field-effect transistor (FET), a tunneling field-effect transistor (TFET), a fin field-effect transistor (FinFET), a metal-oxide-semiconductor field-effect transistor (MOSFET), and/or a heterojunction bipolar transistor (HBT).

FIG. 4 depicts a cross-sectional view of an example wafer 200 that may be used in a semiconductor fabrication process. The example wafer 200 comprises a substrate 202. In this example, the substrate 202 comprises a GaAs substrate, a Ge substrate, a Si substrate, or a Ge/Si substrate.

The example wafer 200 further comprises an arsenic (As) prelayer 204 formed over the substrate 202. The arsenic prelayer 204, in this example, is a graded-temperature arsenic prelayer that may be grown at a graded temperature ramped from 300 to 550° C. In this example, the prelayer thickness is several nanometers but less than 10 nm.

A barrier layer 206 is formed above the arsenic prelayer 204. The barrier layer 206 in this example is grown over the prelayer using MOCVD operations. The barrier layer 206 in this example consists of a GaAs with low-growth-temperature growth or an $In_xGa_{1-x}As$ epitaxy with one or multiple GaAs-based layers. The thickness of the barrier layer(s) in this example is about 5-500 nm. Also, the barrier layer(s) is slightly P or N-type (~$10^{17}$ cm$^{-3}$).

An InAs or Sb-based channel layer 208 is grown over the barrier layer 206. The example channel layer comprises an InAs epitaxy with low-growth-temperature growth or Al(In)Sb/InAs/Al(In)Sb heterostructures with one or more pairs deposited at a temperature of about 300~600° C. In this example, the channel thickness is about 20-500 nm.

The channel layer can be used for the deposition of high-performance electron devices such as tunneling field-effect transistor (TFET). The wafer 200 may be used in a semiconductor fabrication process for fabricating, for example, a high electron mobility transistor (HEMT), a field-effect transistor (FET), a tunneling field-effect transistor (TFET), a fin field-effect transistor (FinFET), a metal-oxide-semiconductor field-effect transistor (MOSFET), and/or a heterojunction bipolar transistor (HBT).

The use of the disclosed techniques may allow for a lattice mismatch between In(Ga)As and GaAs epilayers of about 7.2%. The relaxation degree between InAs and GaAs epilayers using techniques described herein may reach >90%.

The growth techniques disclosed herein may obviate the need for a graded buffer layer, and allow for high-relaxation In(Ga)As epitaxy or Al(Ga)Sb/In(Ga)As/Al(Ga)Sb epilayers to be grown on a GaAs/Ge(Si) heterostructure or various substrates. A cheaper substrate, such as Si, Ge, GaAs, or Ge/Si substrate, may be used with the techniques described herein, and In(Ga)As or Al(Ga)Sb/InAs/Al(Ga)Sb epilayers may be directly grown on cheaper substrates. In some examples, Al(Ga)Sb/In(Ga)As/Al(Ga)Sb heterostructures can be directly grown on a silicon substrate, gallium arsenic substrate, germanium substrate, or Ge/Si substrate by MOCVD operations.

In one embodiment, a method comprises providing a substrate, forming a prelayer over the substrate, forming over the prelayer a barrier layer that includes one of GaAs and InGaAs, and forming a channel layer over the barrier layer.

These aspects and other embodiments may include one or more of the following features. The substrate may comprise a gallium arsenide substrate, a silicon substrate, a germanium substrate, or a Ge/Si substrate. Each of the prelayer, barrier layer, and channel layer may be provided using metal organic chemical vapor deposition (MOCVD) operations. The prelayer may comprise a graded-temperature arsenic prelayer grown with graded temperature ramped from 300 to 550° C. The prelayer thickness may be less than 10 nanometers. The barrier layer may comprise GaAs with low-growth-temperature growth or an $In_xGa_{1-x}As$ epitaxy with one or more GaAs-based layers. The barrier layer thickness may be about 5-500 nanometers. The barrier layer may be slightly P or N-type. The channel layer may comprise an InAs epitaxy with low-growth-temperature growth or Al(In)Sb/InAs/Al(In)Sb heterostructures with one or more pairs deposited at a temperature of about 300 to 600° C. The channel thickness may be about 20-500 nanometers. Periodic 90° misfit dislocations may be generated between the barrier and the channel layers to relax the strain. The channel layer may be used for the deposition of high-performance electron devices such as a tunneling field-effect transistor (TFET).

In another embodiment, a method comprises providing a substrate, forming a prelayer over the substrate, forming a barrier over the prelayer, and forming over the barrier layer a channel layer that includes one of InAs and an Sb-based heterostructure.

These aspects and other embodiments may include one or more of the following features. Each of the prelayer, barrier layer, and channel layer may have been grown using metal organic chemical vapor deposition (MOCVD) operations. The prelayer may have been grown with graded temperature ramped from 300 to 550° C. The prelayer thickness may be less than 10 nanometers. The barrier layer thickness may be about 5-500 nanometers. The barrier layer may be slightly P or N-type. The channel layer thickness may be about 20-500 nanometers. The wafer may comprise periodic 90° misfit dislocations between the barrier and the channel layers to relax the strain.

In yet another embodiment, a method comprises providing a substrate, forming over the substrate a prelayer at a graded temperature, forming a barrier layer over the prelayer, and forming a channel layer over the barrier layer.

In yet another interrelated embodiment, a structure comprises a substrate, a prelayer over the substrate, a barrier layer over the prelayer, and a channel layer over the barrier layer, the channel layer including a heterostructure comprising InAs.

These aspects and other embodiments may include one or more of the following features. The channel layer includes a pair of layers of common composition and an InAs layer between the pair of layers, where the InAs layer is of different composition tan the pair of layers. The heterostructure includes AlSb, AlGaSb, AlInSb, or InAs. The channel layer is disposed within a transistor. The barrier layer is slightly P-type or slightly N-type. The prelayer includes arsenic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate;
   forming a prelayer over a substrate;
   forming over the prelayer a barrier layer that includes an $In_xGa_{1-x}As$ epitaxy with one or more GaAs-based layers; and
   forming a channel layer over the barrier layer;
   wherein a concentration of dopant in the barrier layer is in an order of $10^{17}$ cm$^{-3}$.

2. The method of claim 1, wherein forming the barrier layer includes doping the barrier layer.

3. The method of claim 1, wherein forming the barrier layer includes depositing the one of GaAs and InGaAs on the substrate using a metal organic chemical vapor deposition (MOCVD).

4. The method of claim 1, further comprising fabricating a transistor that includes the channel layer.

5. The method of claim 1, wherein forming the prelayer includes growing the prelayer at a graded temperature.

6. A method comprising:
   providing a substrate;
   forming over the substrate a prelayer at a graded temperature;
   forming a barrier layer over the prelayer; and
   forming a channel layer over the barrier layer;
   wherein the barrier layer includes an $In_xGa_{1-x}As$ epitaxy with one or more GaAs-based layers;
   wherein a concentration of dopant in the barrier layer is in an order of $10^{17}$ cm$^{-3}$.

7. The method of claim 6, wherein forming the prelayer includes growing the prelayer on the substrate at a ramping temperature.

8. The method of claim 6, wherein forming the prelayer includes depositing the prelayer on the substrate using a metal organic chemical vapor deposition (MOCVD).

9. The method of claim 6, wherein forming the prelayer includes depositing As on the substrate.

10. The method of claim 6, further comprising fabricating a transistor that includes the channel layer.

11. The method of claim 6, wherein forming the barrier layer includes doping the barrier layer.

12. The method of claim 1, wherein the substrate comprises a gallium arsenide substrate, a silicon substrate, a germanium substrate, or a Ge/Si substrate.

13. The method of claim 1, wherein forming the prelayer includes growing an arsenic prelayer with graded temperature ramped from 300 to 550° C.

14. The method of claim 1, wherein forming the channel layer includes depositing a heterostructure at a temperature of 300 to 600° C.

15. The method of claim 1, wherein the method further comprises:
    generating 90° misfit dislocations between the barrier and the channel layer.

16. The method of claim 4, wherein the transistor is a tunneling field-effect transistor.

17. A method comprising:
    providing a substrate;
    growing an As prelayer over the substrate at a graded temperature;
    forming over the prelayer a barrier layer that includes an $In_xGa_{1-x}As$ epitaxy with one or more GaAs-based layers;
    forming a channel layer over the barrier layer; and
    generating 90° misfit dislocations between the barrier and the channel layer to relax strain;
    wherein a concentration of dopant in the barrier layer is in an order of $10^{17}$ cm$^{-3}$.

18. The method of claim 17, wherein the prepayer has a thickness of less than 10 nanometers.

19. The method of claim 17, wherein the barrier layer has a thickness of 5 to 500 nanometers.

20. The method of claim 17, wherein the channel layer has a thickness of 20 to 500 nanometers.

* * * * *